(12) United States Patent
Marinus et al.

(10) Patent No.: US 8,894,238 B2
(45) Date of Patent: Nov. 25, 2014

(54) CERAMIC ILLUMINATION DEVICE

(75) Inventors: Antonius Adrianus Maria Marinus, Eindhoven (NL); Omke Jan Teerling, T Harde (NL); Bastiaan Uitbeijerse, Helmond (NL)

(73) Assignee: Koninklijke Philips N.V., Eindhoven (NL)

( * ) Notice: Subject to any disclaimer, the term of this patent is extended or adjusted under 35 U.S.C. 154(b) by 321 days.

(21) Appl. No.: 13/322,704

(22) PCT Filed: May 26, 2010

(86) PCT No.: PCT/IB2010/052347
§ 371 (c)(1),
(2), (4) Date: Mar. 14, 2012

(87) PCT Pub. No.: WO2010/136985
PCT Pub. Date: Dec. 2, 2010

(65) Prior Publication Data
US 2012/0162988 A1 Jun. 28, 2012

(30) Foreign Application Priority Data

May 28, 2009 (EP) .................................. 09161346
Jul. 22, 2009 (EP) .................................. 09166081
May 6, 2010 (EP) .................................. 10162148

(51) Int. Cl.
| F21V 3/00 | (2006.01) |
| F21V 29/00 | (2006.01) |
| F21V 3/04 | (2006.01) |
| F21V 3/02 | (2006.01) |
| F21V 19/00 | (2006.01) |
| F21K 99/00 | (2010.01) |
| H01L 33/64 | (2010.01) |
| F21Y 101/02 | (2006.01) |

(52) U.S. Cl.
CPC ................. F21V 3/02 (2013.01); *H01L 33/641* (2013.01); F21V 3/0409 (2013.01); F21V 29/242 (2013.01); F21V 19/003 (2013.01); F21K 9/135 (2013.01); *F21Y 2101/02* (2013.01); F21V 29/004 (2013.01); F21V 3/04 (2013.01)
USPC ........................ 362/249.02; 362/294; 362/373

(58) Field of Classification Search
USPC ............ 362/249.02, 294, 373, 580, 547, 126, 362/218, 264, 345, 311.02, 545, 800
See application file for complete search history.

(56) References Cited

U.S. PATENT DOCUMENTS

| 1,753,273 A | 4/1930 | Laib |
| 5,083,251 A | 1/1992 | Parker |
| 5,165,784 A | 11/1992 | Loth et al. |

(Continued)

FOREIGN PATENT DOCUMENTS

| CN | 201141532 Y | 10/2008 |
| CN | 201344404 Y | 1/2009 |

(Continued)

*Primary Examiner* — Bao Q Truong
(74) *Attorney, Agent, or Firm* — Meenakshy Chakravorty

(57) ABSTRACT

The present invention provides an illumination device (100) comprising a light source (110) arranged to generate light, a carrier (120) arranged to support the light source and an envelope (130) enclosing the light source and the carrier. Further, the carrier is arranged in thermal contact with the envelope and both the envelope and the carrier are made of ceramic material. The present invention is advantageous in that it provides an illumination device providing an effective heat transfer.

14 Claims, 4 Drawing Sheets

(56) References Cited

U.S. PATENT DOCUMENTS

| | | | |
|---|---|---|---|
| 6,626,554 B2 | 9/2003 | Rincover et al. | |
| 7,261,437 B2 | 8/2007 | Coushaine et al. | |
| 7,461,951 B2 | 12/2008 | Chou et al. | |
| 7,575,339 B2 * | 8/2009 | Hung | 362/230 |
| 7,976,182 B2 | 7/2011 | Ribarich | |
| 8,220,956 B2 * | 7/2012 | Lai et al. | 362/218 |
| 8,227,962 B1 * | 7/2012 | Su | 313/46 |
| 8,317,358 B2 * | 11/2012 | Chou | 362/218 |
| 8,547,002 B2 | 10/2013 | Lenk et al. | |
| 2005/0189557 A1 | 9/2005 | Mazzochette et al. | |
| 2006/0043546 A1 | 3/2006 | Kraus | |
| 2006/0098440 A1 | 5/2006 | Allen | |
| 2006/0227558 A1 | 10/2006 | Osawa et al. | |
| 2006/0274529 A1 | 12/2006 | Cao | |
| 2007/0230188 A1 | 10/2007 | Lin | |
| 2008/0310158 A1 | 12/2008 | Harbers et al. | |
| 2009/0080187 A1 * | 3/2009 | Chou | 362/231 |
| 2009/0122530 A1 | 5/2009 | Beers et al. | |
| 2010/0008086 A1 | 1/2010 | Broitzman | |
| 2011/0089838 A1 | 4/2011 | Pickard et al. | |
| 2012/0069570 A1 * | 3/2012 | Marinus et al. | 362/249.02 |
| 2012/0134158 A1 * | 5/2012 | Yang et al. | 362/294 |

FOREIGN PATENT DOCUMENTS

| | | |
|---|---|---|
| DE | 19624087 A1 | 12/1997 |
| DE | 202007008258 | 12/2007 |
| DE | 202008016867 | 4/2009 |
| JP | 08293204 A | 11/1996 |
| JP | 2001243809 A | 9/2001 |
| JP | 2007234639 A | 9/2007 |
| WO | 2008078235 A2 | 7/2008 |
| WO | 2009150574 | 12/2009 |

* cited by examiner

CERAMIC ILLUMINATION DEVICE

FIELD OF THE INVENTION

The present invention relates to an illumination device and, in particular, to an illumination device made of ceramic material.

BACKGROUND OF THE INVENTION

Light-emitting-diode (LED) lamps are known in the art. A LED lamp is a lamp that uses LEDs as the source of light. In such lamps, multiple diodes may be used for either increasing the output power of the lamp or for providing a white light as a single LED emits in a narrow band of wavelengths. LED lamps may be used for general lighting or even more specific lighting as the colour and the output power may be tuned.

Generally, a lamp or illumination device comprises a light source arranged to generate light and mounted on, or at least connected to, a circuit board. The light source is arranged within an encapsulating housing usually having the shape of a bulb. In addition to provide maximum light output and/or a specific colour of light, the design of an illumination device needs to take into account the evacuation of heat generated by the light source(s) and/or the electronics connected to the light source(s).

For example, American patent application US2010/0008086 discloses a white LED-based lighting device comprising a group of solid state light emitting diodes, electronics to activate the light emitting diodes and an encapsulating housing. For conducting or transferring outwardly heat generated from within the white light LED device, the encapsulating housing includes air vents and heat-sinking components.

SUMMARY OF THE INVENTION

Generally, a disadvantage of prior art systems may be that they require specific components for evacuation of heat (e.g. air-vents and an arrangement of heat sinking components), thereby rendering the design of the system rather complex or resulting in an expensive system.

Hence, it is an object of the present invention to alleviate the above mentioned drawback, and to provide an illumination device providing an effective heat transfer and having a more simple design.

This and other objects of the present invention are achieved by means of an illumination device as defined by the independent claim. Other advantageous embodiments of the present invention are defined by the dependent claims.

According to a first aspect of the invention, an illumination device as defined in claim 1 is provided. The illumination device comprises a light source arranged to generate light, a carrier arranged to support the light source and an envelope enclosing the light source and the carrier. The light source is in thermal contact with the carrier and the carrier is arranged in thermal contact with the envelope for dissipating heat out of the illumination device. Both the envelope and the carrier are made of ceramic material.

The present invention makes use of an understanding that the envelope (or bulb) of the illumination device may act as a heat sink and serve for dissipating heat (e.g. generated by the light source or any electronics connected to the light source) out of the illumination device. For this purpose, the light source is arranged in thermal contact with a carrier which itself is in thermal contact with the envelope and both the carrier and the envelope comprises ceramic material (a kind of material having good thermal conductivity). The present invention is advantageous in that it does not require any additional (or specific) components for heat transfer since this function is provided by the specific arrangement of the main parts of the illumination device, namely the light source(s), the carrier and, in particular, the envelope. Further, with the present invention, the whole surface of the illumination device, i.e. the envelope, acts as a heat sink, thereby providing a relatively large surface for heat transfer. Thus, the present invention is also advantageous in that an effective transfer of heat to the outside environment of the illumination device is provided.

According to an embodiment, the envelope may comprise a transmissive region arranged to transmit at least part of the light generated by the light source (especially when the light source emits in the visible range of the wavelength spectrum, i.e. 380-780 nm). The transmissive region may be translucent (transmitting and scattering of light) or be transparent (substantial unhindered transmission). Advantageously, the transmissive region is translucent, thereby preventing a user from perceiving the light source(s) and optional electronics within the envelope. Thus, the envelope or encapsulating housing of the illumination device is advantageous in that it integrates a number of functionalities such as an optical function, a thermal function and a mechanical function.

According to an embodiment, the carrier may comprise a transmissive region arranged to transmit at least part of the light generated by the light source. Alternatively or in addition, the carrier may comprise a reflective region arranged to reflect at least part of the light generated by the light source(s). These embodiments are advantageous in that the carrier may be designed with a number of regions being either transmissive or reflective such that, e.g., a desired light distribution is achieved.

According to an embodiment, the ceramic material may be poly crystalline aluminium oxide (PCA), which is advantageous in that it is a translucent ceramic material having a good thermal conductivity (in the range of about 20 W/mK).

According to an embodiment, the ceramic material may have a thermal conductivity of at least about 5 W/mK.

According to an embodiment, the envelope may comprise at least two enveloping parts which, when joined together, form the envelope or encapsulating housing of the illumination device. The present embodiment is advantageous in that it provides a convenient design which facilitates the assembly of the illumination device (such as a lamp or spot light). Using two enveloping parts, the light source and the carrier may conveniently be mounted together while the two enveloping parts are separated and then enclosed in the envelope by joining the two enveloping parts. It will be appreciated that more than two enveloping parts may be employed and that the present embodiment is not limited to an illumination device comprising an envelope made of only two enveloping parts.

According to an embodiment, the envelope may have the shape of a bulb (or lamp bulb). In particular, the enveloping parts of the envelope as defined in the above embodiment may be two bulb halves.

According to an embodiment, an enveloping part and at least part of the carrier (or a first part of the carrier or first carrier) may form a single integrated part, which is advantageous in that the number of components is reduced, thereby facilitating the assembly of the illumination device even further. The present embodiment is also advantageous in that the enveloping part and the part of the carrier (e.g. a bulb half and half of the carrier) may be manufactured as one single part from one single mould. The corresponding enveloping part(s)

and part of the carrier for forming the envelope and the carrier may also be manufactured from one single mould, preferably the same mould.

According to another embodiment, the carrier may be arranged at a junction between two enveloping parts. In the present embodiment, the carrier and the enveloping parts are separate parts.

According to an embodiment, the enveloping parts may advantageously be configured to fit one to another, thereby facilitating the assembly of the illumination device.

According to an embodiment, the carrier may be arranged along an axis extending from the base of the illumination device to its top. Alternatively, the carrier may be arranged along a direction crossing an axis extending from the base of the illumination device to its top. In these embodiments, the carrier divides the space defined by the envelope in at least two compartments. A plurality of light sources may then advantageously be used and distributed on each side of the carrier such that an uniform illumination is provided.

According to an embodiment, the light source may be at least one light emitting diode (LED) or at least one LED package. The light source may for instance comprise an RGB LED (red green blue light emitting diode), or a plurality of diodes arranged to provide white light, such as an RGB combination, or a combination of blue and yellow, or a combination of blue, yellow and red, etc. Optionally, the illumination device may be arranged to provide coloured light.

The light source may also comprise a plurality of light sources (such as a plurality of LEDs), that is (are) able to provide light at different predetermined wavelengths, depending upon the driving conditions. Hence, in a specific embodiment, the illumination device may further comprise a controller (attached to or external from the illumination device), arranged to control the colour of the illumination device light in response to a sensor signal or a user input device signal.

In the following, the invention may be further described with reference to a LED as preferred embodiment of the light source. Hence, in the following the term "LED" may also refer to a light source (or a plurality of light sources) in general, unless indicated otherwise or clear from the context, but preferably refers to a LED. Further, the term "LED" especially refers to solid state lighting (solid state LEDs).

According to an embodiment, the light source may emit light in the visible range, but may also, in another embodiment, alternatively or additionally emit in the UV range. As mentioned above, the light source may comprise a LED. In a further embodiment, the light source is a LED arranged to generate blue light. The blue light emitting source may be used per se, or may be used in combination with luminescent material, e.g. arranged at the envelope or at least one of the enveloping parts, such as to provide white light, or may be used in combination with one or more other LEDs generating light at other wavelengths. Combinations of such embodiments may also be applied.

In the present application, the term "at least" may in embodiments also indicate "all" or "completely".

It is noted that the invention relates to all possible combinations of features recited in the claims.

BRIEF DESCRIPTION OF THE DRAWINGS

This and other aspects of the present invention will now be described in more detail, with reference to the appended drawings showing various exemplifying embodiments of the invention.

DETAILED DESCRIPTION

Figure 1:
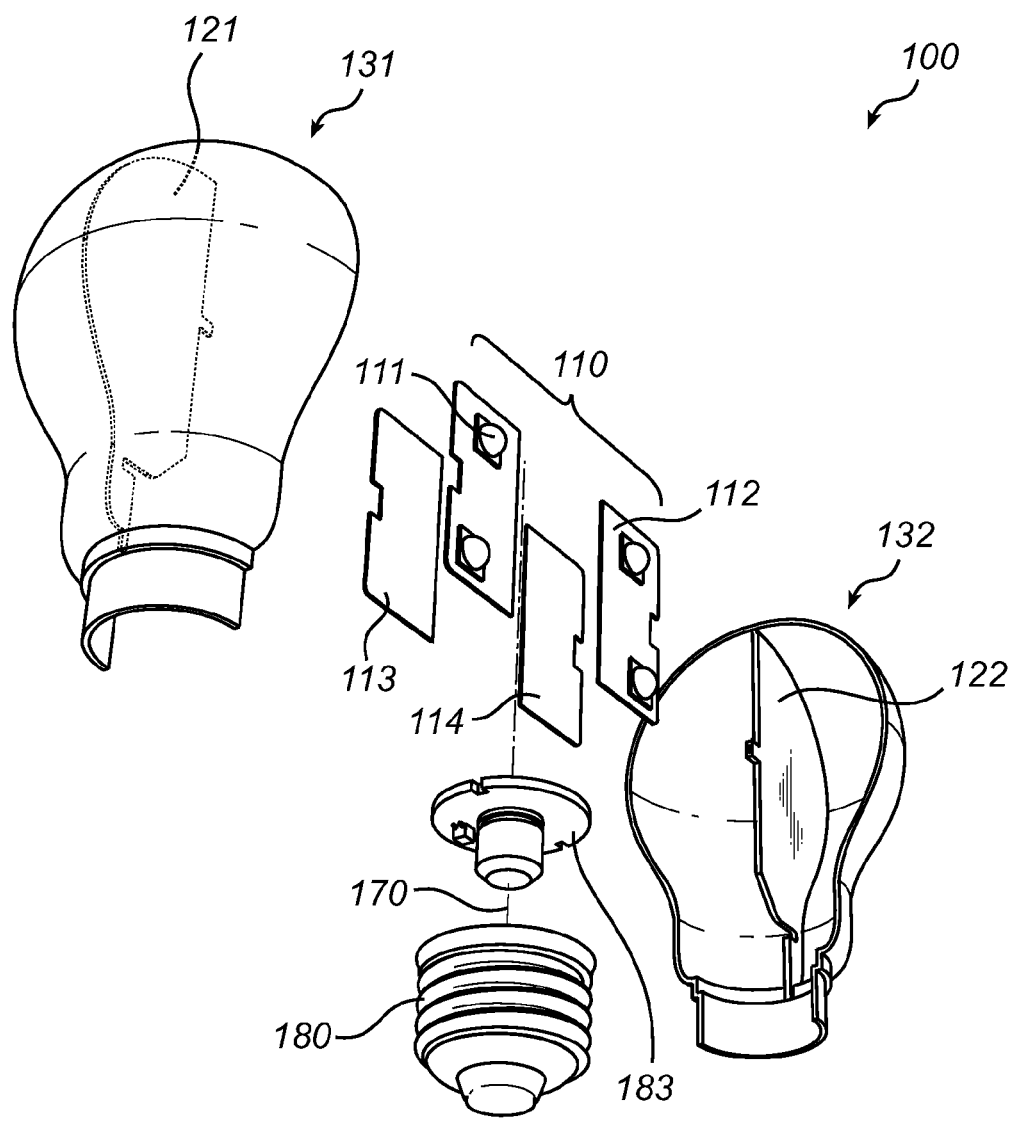
FIG. 1 is an exploded view of an illumination device according to an exemplifying embodiment of the present invention.

With reference to FIG. 1, a first embodiment of the present invention is described.

FIG. 1 shows an exploded view of an illumination device 100 according to an embodiment of the present invention. The illumination device comprises a light source 110 arranged to generate light. In the present example, the light source 110 corresponds to a plurality of LED packages 111, 112, 113 and 114. Although FIG. 1 shows a plurality of LED packages to form the light source 110, a single LED or LED package may also be used.

The illumination device 100 comprises a carrier 120 (see FIG. 4c) which is represented by two carrier parts 121 and 122 (or a first carrier 121 and a second carrier 122) in FIG. 1. The carrier 120 is arranged to support the light source 110 or LED packages 111-114. In the following, the two carrier parts 121 and 122 may also be referred to as the single carrier 120, when the two parts are indeed joined together, such as in FIG. 4c.

The illumination device 100 comprises also an envelope 130 for enclosing the light source 110 and the carrier 120. In FIG. 1, the envelope 130 is represented by two enveloping parts 131 and 132 which, when joined together, form the envelope or encapsulating housing 130, such as shown in FIG. 4c. Although the envelope may be made of two enveloping parts, the present invention is not limited to such a design and an envelope made of a single part or more than two parts may also be envisaged.

The light sources 111-114 (or light source 110) are arranged in thermal contact with the carrier 120 (or carrier parts 121 and 122 in FIG. 1) and the carrier 120 is arranged in thermal contact with the envelope 130 (or enveloping parts 131 and 132, respectively, in FIG. 1).

Generally, the carrier 120 can be inserted in the envelope 130. The carrier may have any shape. In FIG. 1, the envelope 130 has a standard bulb shape and the carrier 120 may then preferably have the shape of a disk or part of a disk.

Further, the contact surface between the carrier 120 and the envelope 130 may advantageously not be punctual but, instead, extends along a portion of the inside of the envelope 130. The contact surface may for instance extends along a circumference (or part of a circumference) of the envelope such that an effective heat transfer is provided.

Using such a design, when the illumination device is powered on, heat may be generated by the light source(s) 111-114 and be dissipated out of the illumination device 100 via the carrier 120 and the envelope 130. Both the envelope and the carrier comprises ceramic material for improving the heat transfer out of the illumination device.

The term "ceramic" is known in the art and may especially refer to an inorganic, non-metallic solid prepared by the action of heat and subsequent cooling. Ceramic materials may have a crystalline or partly crystalline structure, or may be amorphous, i.e., a glass. Most common ceramics are crystalline. The term ceramic especially relates to materials that have sintered together and form pieces (in contrast to powders). The ceramics used herein are preferably polycrystalline ceramics. The ceramic material may for instance be based on one or more materials selected from the group consisting of $Al_2O_3$, AlN, $SiO_2$, $Y_3Al_5O_{12}$ (YAG), an $Y_3Al_5O_{12}$ analogue, $Y_2O_3$ and $TiO_2$, and $ZrO_2$. The term an $Y_3Al_5O_{12}$ analogue refers to garnet systems having substantially the same lattice structure as YAG, but wherein Y and/or Al and/or O, especially Y and/or Al are at least partly replaced by another ion, such as one or more of Sc, La, Lu and G, respectively.

According to an embodiment, the ceramic material may be $Al_2O_3$, which is a translucent material. $Al_2O_3$ can also be made highly reflective when it is sintered at a temperature in the range of about 1300-1700° C., such as in the range of about 1300-1500° C., like 1300-1450° C. This material is also known in the art as "brown" PCA (polycrystalline alumina).

The term "based on" indicates that the starting materials to make the ceramic material substantially consist of one or more of the herein indicated materials, such as for instance $Al_2O_3$ or $Y_3Al_5O_{12}$ (YAG). This does however not exclude the presence of small amounts of (remaining) binder material, or dopants, such as Ti for $Al_2O_3$, or in an embodiment Ce for YAG.

The ceramic material may have a relatively good thermal conductivity. Preferably, the thermal conductivity is at least about 5 W/mK, such as at least about 15 W/mK, even more preferably at least about 100 W/mK. YAG has a thermal conductivity in the range of about 6 W/mK, poly crystalline alumina (PCA) in the range of about 20 W/mK, and AlN (aluminum nitride) in the range of about 150 W/mK or larger.

The envelope 130 may especially be arranged to receive all light from the light source(s) 111-114. Further, the envelope 130 may especially be arranged to allow escape of light of the light source(s) 111-114.

When a plurality of light sources are used and the light sources emit light at different wavelengths, the envelope 130 may thus also be indicated as a mixing chamber. Mixing may also be of relevance when a luminescent material is used that is arranged remote from a light source (from which it absorbs part of the light to provide luminescent material light), e.g. arranged at the envelope or part of the envelope.

Advantageously, the envelope 130 may comprise a transmissive region arranged to transmit at least part of the light generated by the light sources 111-114. In particular, the envelope 130 may be made of a material having light transmissive properties such that an efficient transmission of light through the envelope is achieved.

According to an embodiment, the carrier 120 may also comprise a transmissive region, which is advantageous in that light coming from a compartment of the envelope in direction to the carrier may be transmitted through the carrier and, then, transmitted out of the illumination device via the envelope 130. Alternatively, or in addition, the carrier 120 may comprise a reflective region arranged to reflect at least part of the light generated by the light source(s), which is advantageous in that light emitted in a compartment of the envelope and directed towards the carrier may be reflected against the carrier and transmitted out of the illumination device via the same compartment of the envelope. It will be appreciated that the carrier may be designed with a number of regions being either transmissive or reflective such that, e.g., a desired light distribution is achieved.

Advantageously, the ceramic material may be poly crystalline aluminium oxide (PCA), which is advantageous in that it is a translucent ceramic material having a good thermal conductivity (of about 20 W/mK).

According to an embodiment, the ceramic material may have a thermal conductivity of at least about 150 W/mK such that an effective heat transfer is provided.

Referring to FIG. 1, the envelope 130 may be bulb-shaped and the enveloping parts 131 and 132 may be two bulb halves, thereby providing an illumination device which has a standard lamp shape.

As the carrier 120 divides the illumination device 100 in two compartments, the light source(s) 111-114 of the illumination device may advantageously be distributed on each side of the carrier 120 (or first and second carriers 121 and 122 in FIG. 1) for improving the uniformity of the light emitted from the illumination device 100.

Referring again to FIG. 1, the illumination device 100 may also comprise a socket 180 for holding the enveloping parts 131 and 132 and for providing, via a connecting board 183, electricity to the LED packages 111-114.

Figure 4A:
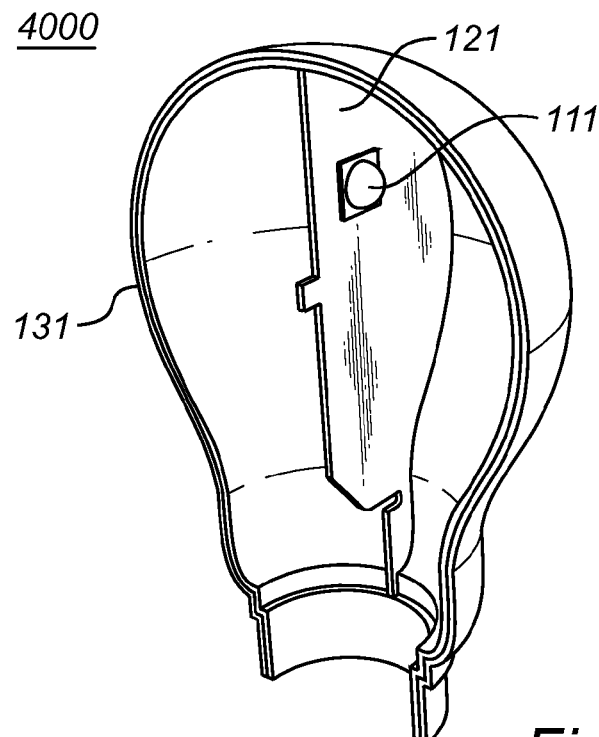
FIG. 4a-4c illustrate, in a schematic manner, a process flow for assembly of an illumination device according to an exemplifying embodiment of the present invention.

According to an embodiment, referring to e.g. FIG. 1 and FIG. 4a, an enveloping part 131 and a part 121 of the carrier may form a single integrated part. Such an embodiment is advantageous in that it further reduces the number of components for assembling the illumination device, thereby facilitating even more its assembly.

Figure 2:
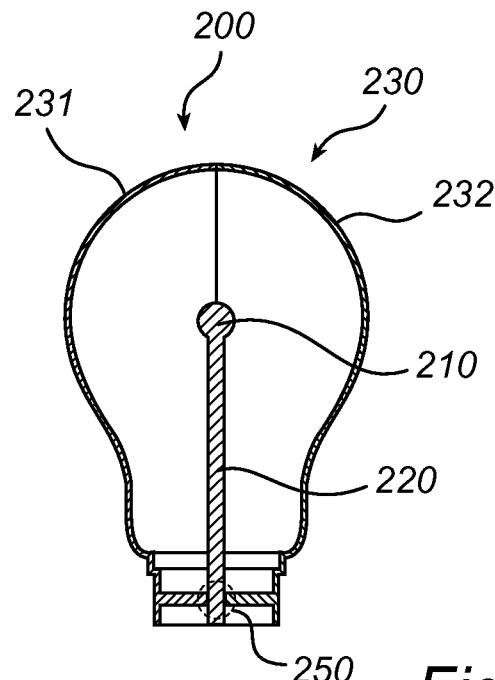
FIG. 2 is a schematic view of an illumination device according to another exemplifying embodiment of the present invention.

Referring to FIG. 2, another embodiment of the present invention is described.

FIG. 2 is a schematic view of an illumination device 200 comprising a light source 210, which may be a LED, arranged to generate light, a carrier 220 arranged to support the light source 210 and an envelope 230 enclosing the light source 210 and the carrier 220. The carrier 220 is arranged in thermal contact with the light source 210 and with the envelope 230. The carrier and the envelope are made of ceramic material such that heat generated by the light source 210 can be dissipated outside the illumination device 200 by heat transfer via the carrier 220 and through the envelope 230.

Still referring to FIG. 2, according to another embodiment, the envelope may comprise two enveloping parts 231 and 232 which, when joined together, form the envelope or encapsulating housing 230. The carrier 220 may then be arranged at a junction 250 between the two enveloping parts 231 and 232, thereby providing a mechanical and thermal interface between the carrier 220 and the enveloping parts 231 and 232 at the junction 250.

With reference to any embodiments described above with reference to FIGS. 1 and 2, wherein the envelope comprises more than one part, the enveloping parts of the envelope 130 or 230 of the illumination devices 100 and 200, respectively, may be configured to fit one to another.

Figure 3:
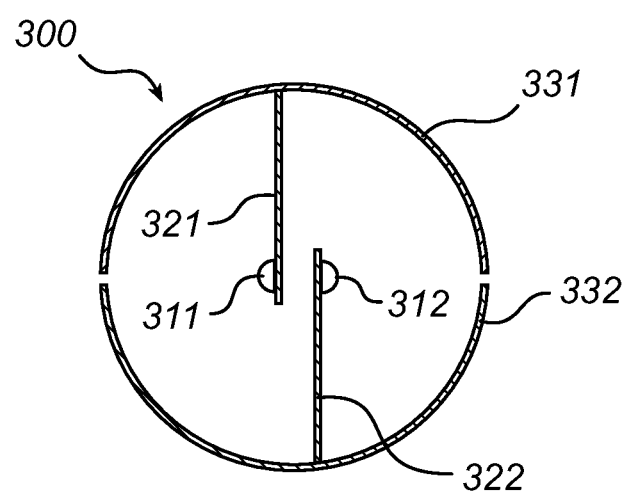
FIG. 3 is a schematic view of an illumination device according to another exemplifying embodiment of the present invention.

With reference to FIG. 3, another embodiment of the present invention is described.

FIG. 3 is a schematic top view of an illumination device 300 comprising two light sources 311 and 312, e.g. two LEDs, arranged to generate light. The two LEDs 311 and 312 are mounted on two carriers 321 and 322 (or two parts of a carrier) arranged to support the LEDs 311 and 312, respectively. In the present embodiment, a single LED package is mounted on, or attached to, a carrier. Alternatively, a plurality of LED packages may be mounted on a first carrier.

As illustrated in FIG. 3, the first carrier 321 attached to a first enveloping part 331 of the envelope may extend in the volume defined by the second enveloping part 332 of the envelope when the two enveloping parts are joined together. Similarly, the second carrier 322 attached to the second enveloping part 332 of the envelope may extend in the volume defined by the first enveloping part 331 of the envelope when the two enveloping parts are joined together. In other words, the first carrier 321 and the second carrier 322 may not be exactly arranged in front of each other but, instead, slightly displaced.

In the present embodiment, as for the embodiments described with reference to FIGS. 1 and 2, the carriers 321 and 322 are arranged along an axis 170 (see FIG. 1) extending from the base of the illumination device to its top. Alternatively, the carrier may be arranged along a direction crossing the axis 170 extending from the base of the illumination device to its top. In either case, the carriers define compartments within the envelope of the illumination device.

Figure 4B:
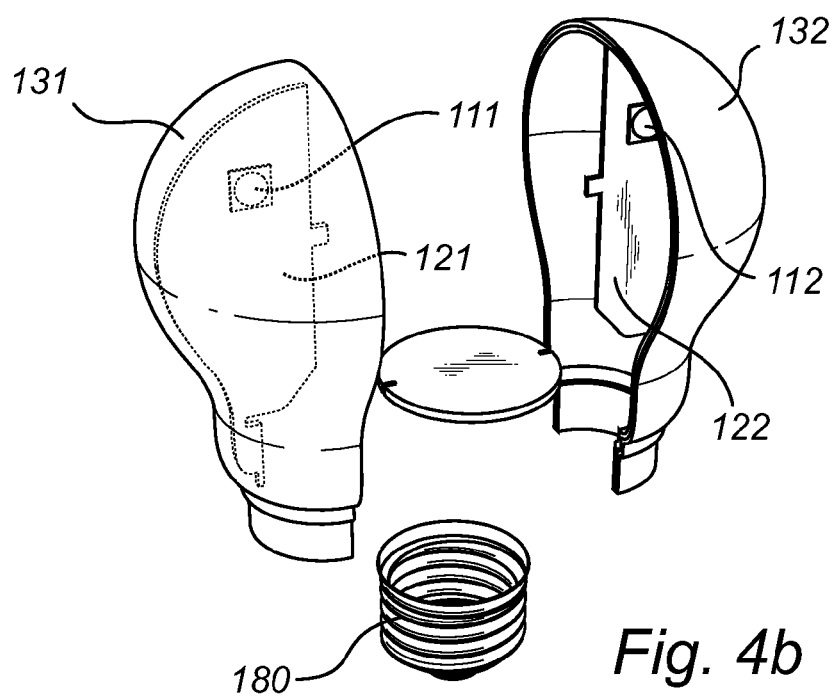
Figure 4C:
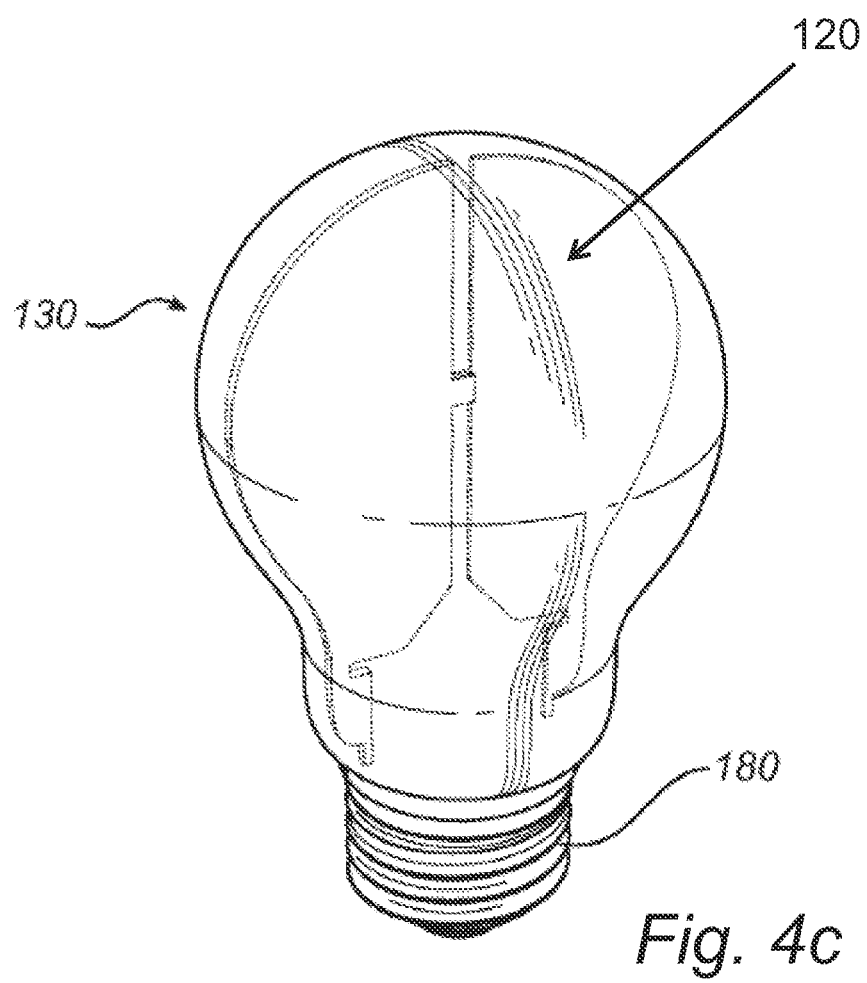

With reference to FIGS. 4*a*-4*c*, there is disclosed a process flow 4000 for assembly of an illumination device according to an embodiment of the present invention.

FIGS. 4*a*-4*c* schematically illustrate the assembly of an illumination device comprising a first bulb half 131 with a first carrier 121 on which a first light source 111 is mounted and a second bulb half 132 with a second carrier 122 on which a second light source 112 is mounted.

FIG. 4*a* shows the first enveloping part or bulb half 131 comprising the first carrier 121. The first bulb half 131 and the first carrier 121 may be a single integrated part, e.g. made out of a single mould. Alternatively, the first carrier 121 and the first bulb half are two separate parts and the first carrier 121 may be glued to the inside of the first bulb half 131. Advantageously, the glue has good thermal conductive properties such that heat can effectively be transferred from the first carrier 121 to the first bulb half 131.

In a first step 4100, a light source 111 is mounted in thermal contact with the first carrier 121. The light source 111 may for instance be attached to the carrier by means of a clip.

A similar step may then be applied with the second carrier 122 to which a second light source 112 is mounted in thermal contact.

In a second step 4200, the first light source 111, the first carrier 121, the second light source 112 and the second carrier 122 are enclosed by joining the two enveloping parts 131 and 132, such as illustrated in FIG. 4*b*.

Alternatively, the carrier may be inserted at a junction between two enveloping parts and fixed between the two enveloping parts by mechanical pressure such that a good thermal contact is provided between the carrier and the enveloping parts for heat dissipation.

As a result, an envelope 130 such as shown in FIG. 4*c* is formed. The envelope 130 (or a base of the envelope 130) may then be inserted in a socket 180 for holding the two enveloping parts 131 and 132. The socket 180 may also be configured to provide electricity to the illumination device such that electrical power can be transmitted to the light sources 111 and 112.

In this respect, the light source may advantageously be high-voltage (HV) LEDs, which is advantageous in that the number of components necessary to form the illumination device is further reduced as HV LEDs do not require any driver.

Even more advantageously, phase-shifted HV LEDs may be used and distributed on the carrier 130 (or the carriers 131 and 132) for preventing any stroboscopic effect.

The present invention may be useful for any kind of lamps such as a spot light or a standard lamp. The present invention may be applied for illumination devices used in homes, hospitality, outdoor, offices, industry and retail.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

For example, although the embodiments described above relate to an illumination device having a standard bulb shape, any other suitable shape may be envisaged.

Further, although some of the embodiments described above comprise a first and a second carrier, it will be appreciated that the illumination device may comprise only one carrier in thermal contact with the envelope or at least one of the enveloping parts. Further, the illumination device may also comprise more than two carriers or carrier parts.

It will also be appreciated that the number of LEDs or light sources and their respective wavelengths will be selected in accordance with the desired application.

The invention claimed is:

1. An illumination device comprising:
    a light source arranged to generate light,
    a carrier arranged to support said light source, said light source being in thermal contact with said carrier,
    an envelope enclosing said light source and said carrier,
    wherein the carrier is arranged in thermal contact with the envelope for dissipating heat out of said illumination device, said envelope and said carrier comprising a ceramic material,
    wherein the envelope includes at least two enveloping parts which, when joined together, form said envelope, and
    wherein at least one of the enveloping parts and at least part of the carrier form a single integrated part.

2. The illumination device according to claim 1, wherein said envelope comprises a first transmissive region arranged to transmit at least part of the light generated by the light source.

3. The illumination device according to claim 1, wherein said carrier comprises a second transmissive region arranged to transmit at least part of the light generated by the light source and/or a reflective region arranged to reflect at least part of the light generated by the light source.

4. The illumination device according to claim 1, wherein the ceramic material is polycrystalline aluminum oxide.

5. The illumination device according to claim 1, wherein the ceramic material has a thermal conductivity of at least about 5 W/mK.

6. The illumination device according to claim 1, wherein the envelope is bulb-shaped.

7. The illumination device according to claim 1, wherein the enveloping parts are two bulb halves.

8. The illumination device according to claim 1, wherein the carrier is arranged at a junction between the two enveloping parts.

9. The illumination device according to any one of claim 1, wherein the enveloping parts are complementary and configured to fit one to another.

10. The illumination device according to claim 1, wherein the carrier is arranged along an axis extending from the base of the illumination device to its top or along a direction crossing an axis extending from the base of the illumination device to its top.

11. The illumination device according to claim 1, wherein the light source comprises at least one light emitting diode (LED) or at least one LED package.

12. The illumination device according to claim 1, wherein the ceramic material is translucent, 13. An illumination device comprising:
    a light source arranged to generate light,
    a carrier arranged to support said light source, said light source being in thermal contact with said carrier,
    an envelope enclosing said light source and said carrier, wherein the carrier is arranged in thermal contact with the envelope for dissipating heat out of said illumination device, said envelope and said carrier comprising a ceramic material, wherein the envelope includes at least two enveloping parts which, when joined together, form said envelope, and wherein the carrier is arranged at a junction between the two enveloping parts.

14. An illumination device, comprising:

a light source operable to emit light;

a carrier in support of the light source, the light source being in thermal contact with said carrier;

a multi-part envelope enclosing said light source and said carrier, wherein the carrier is arranged in thermal contact with the envelope for dissipating heat out of said illumination device through the envelope;

the envelope and the carrier including a ceramic material; wherein the multi-part envelope includes at least two enveloping parts which are joined together to form the envelope; and the multi-part envelope including at least one enveloping part and at least part of the carrier to form a single integrated part.

* * * * *